US009094068B2

United States Patent
Hosseinzadeh-Shanjani et al.

(10) Patent No.: US 9,094,068 B2
(45) Date of Patent: Jul. 28, 2015

(54) TRANSMIT NOISE AND IMPEDANCE CHANGE MITIGATION IN WIRED COMMUNICATION SYSTEM

(71) Applicant: Entropic Communications, LLC, Carlsbad, CA (US)

(72) Inventors: Payman Hosseinzadeh-Shanjani, San Diego, CA (US); Branislav Petrovic, La Jolla, CA (US)

(73) Assignee: ENTROPIC COMMUNICATIONS, LLC, Carlsbad, CA (US)

( * ) Notice: Subject to any disclaimer, the term of this patent is extended or adjusted under 35 U.S.C. 154(b) by 96 days.

(21) Appl. No.: 14/052,399

(22) Filed: Oct. 11, 2013

(65) Prior Publication Data

US 2015/0103951 A1    Apr. 16, 2015

(51) Int. Cl.
*H03K 17/16*  (2006.01)
*H04B 1/04*  (2006.01)
*H03K 19/00*  (2006.01)

(52) U.S. Cl.
CPC .......... *H04B 1/0475* (2013.01); *H03K 19/0005* (2013.01); *H04B 2001/0408* (2013.01)

(58) Field of Classification Search
CPC .......................... H03K 19/0005; H04B 1/0475

USPC .................................. 326/21, 26, 27, 30, 82
See application file for complete search history.

(56) References Cited

U.S. PATENT DOCUMENTS

| | | | | |
|---|---|---|---|---|
| 5,274,671 | A  * | 12/1993 | Johnson | 375/257 |
| 6,310,489 | B1 * | 10/2001 | Yuan et al. | 326/30 |
| 2007/0247185 | A1 * | 10/2007 | Oie et al. | 326/30 |
| 2008/0030221 | A1 * | 2/2008 | Lee et al. | 326/30 |
| 2008/0272800 | A1 * | 11/2008 | Haig et al. | 326/30 |
| 2010/0237901 | A1 * | 9/2010 | Lee | 326/30 |

* cited by examiner

*Primary Examiner* — Don Le
(74) *Attorney, Agent, or Firm* — McAndrews, Held & Malloy, Ltd.

(57) ABSTRACT

A method, system and circuit for providing for part or all of a transmitter, when it is in mute mode (not actively transmitting), to be turned off, removed, decoupled or modified in general in order to reduce the total noise submitted by the transmitter to the wired network into network controller. In parallel, an auxiliary circuit or impedance is added or coupled to the transmitter in order to mitigate the total return loss change of the transmitter. When in active transmitter mode, this auxiliary circuit or impedance will be removed or decoupled from the transmitter and transmitter will transmit in normal mode.

26 Claims, 3 Drawing Sheets

TRANSMIT NOISE AND IMPEDANCE CHANGE MITIGATION IN WIRED COMMUNICATION SYSTEM

BACKGROUND

In a network, impedance change or Return Loss (RL) change of one or more nodes while another node is transmitting or receiving may cause interference. This is because a signal propagating through the network is a composite of all reflections of all nodes. Therefore, if any reflected signal component changes, the composite will also change, affecting reception or transmission. This is shown in FIG. 1, which depicts multiple Customer Premises Equipment (CPEs), or nodes 10, 10', 10", in a network (of coaxial cables 16 and taps 15, 15' and 15" connecting CPE units and Network Controller (NC 14)). Single port taps are shown for simplicity, but often multiport taps are used in a typical CATV plant showing the effects of adjacent nodes return loss change. As shown in FIG. 1, the signal propagating to network controller (NC) 14 includes direct path data signal 12 and reflections 18 from nodes 10' and 10". If the impedance of any of the nodes 10' or 10" changes, the reflections will change and consequently the received signal at NC 14 will change. Depending on isolation of nodes and the amount of RL change, the effect can degrade the link, cause packet errors, and in some cases may disable communications.

For the above reasons, as taught in the prior art, all the nodes are always kept in the same state (in the transmit mode with unchanged output impedance) all the time, no matter if they are actively transmitting or not. When not transmitting any data or intended content, but ready to transmit data at any moment, this is referred to as a "transmit-ready" or "mute" state.

However, aggregate noise power of all the mute nodes while another node is transmitting will degrade the sensitivity of the receiver or NC 14 to the actively transmitting node. Alternatively, in the prior art an opposite choice is made by turning the transmitters off, so that noise is eliminated, but at the expense of significant impedance/return loss changes, and increased delay in turning the transmitters back on.

Clearly, achieving both low noise and unchanged impedance is advantageous, and that is the objective of the claimed embodiments.

SUMMARY

In the claimed embodiments, part or all of a transmitter, when it is in mute mode (not actively transmitting), will be turned off, removed or modified in general in order to reduce the total noise submitted by the transmitter to the transmission line. In parallel, an auxiliary circuit or impedance will be added to the transmitter in order to mitigate the total return loss change of the transmitter. When in active transmitter mode, this auxiliary circuit or impedance will be removed from the transmitter, and transmitter will transmit in normal mode.

BRIEF DESCRIPTION OF THE DRAWINGS

The disclosed method, system, and apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof

DETAILED DESCRIPTION

The claimed embodiments herein solve the problems stated above. In the claimed method, system, and circuit, part or all of the transmitter, when it's in mute mode (not actively transmitting), will be turned off, removed or modified in general in order to reduce the total noise submitted by the transmitter to the transmission line.

In parallel, an auxiliary circuit or impedance will be added to the transmitter in order to mitigate the total return loss change of the transmitter. The term impedance is defined as having a resistive component, and/or a capacitive component, and/or an inductive component, and/or a reactive component.

Figure 1:
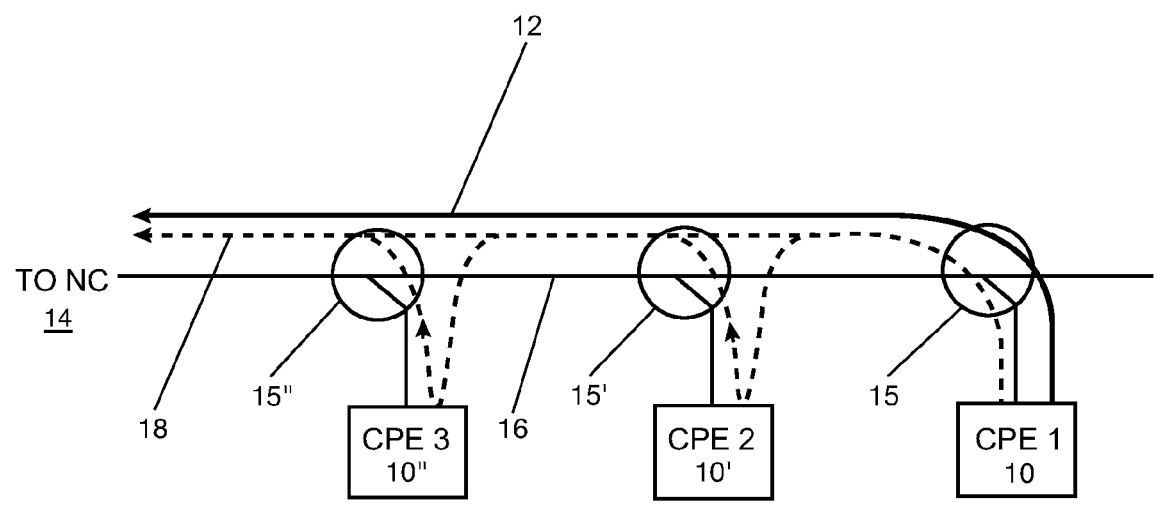
FIG. 1 is an illustration of the effects of adjacent nodes return loss changes.
Figure 2:
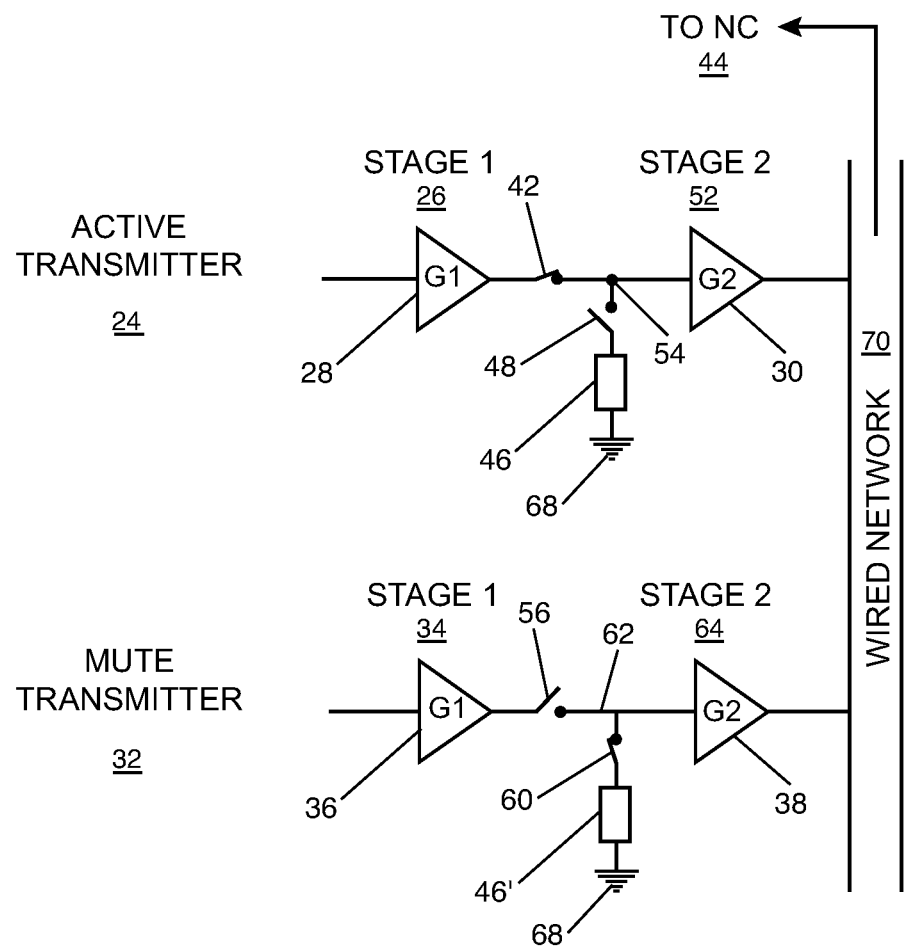
FIG. 2 illustrates an active transmitter and a mute transmitter containing the preferred embodiment
Figure 3:
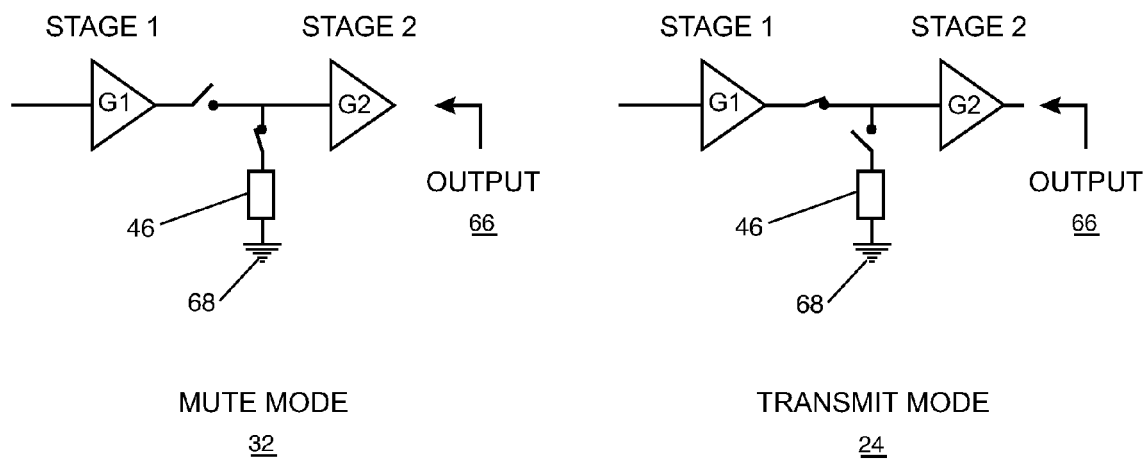
FIG. 3 illustrates the preferred embodiment on a single transmitter in the active and mute state.

When in active transmit mode, this auxiliary circuit or impedance will be removed from the transmitter and transmitter will transmit in normal mode. Muting of the non-active transmitter and the addition or removal of the impedance component can be achieved by hardware switches, software, and firmware or by any other method well known in the art. The preferred embodiments are shown in FIGS. 2 and 3. FIG. 2 shows two nodes, active transmitter 24 and mute transmitter 32. Although the figure shows two transmitters, this disclosure is intended to include any number of transmitters with each transmitter in one of the two modes. First node 24, in this figure the active transmitter, has at least two stages, stage 1 26 comprising a first stage amplifier 28 and stage 2 52 comprising second stage amplifier 30. Second node 32, in this figure mute transmitter, has at least two stages, stage 1 34 comprising first stage amplifier 36 and stage 2 64 comprising second stage amplifier 38. Again, although two stages are shown, this disclosure is intended to include any number of stages as required by the intended use. As shown in the figure, active transmitter 24 (in an active state) is coupled by switch 42 between first stage amplifier 28 and second stage amplifier 30. As previously indicated the coupling can be provided in any manner well known in the art. This provides for a clear path over wired network 70 to network controller (NC) 44. Simultaneously, compensation impedance 46 via an auxiliary circuit, or the like is decoupled by the switch 48 from connecting line 54 between first stage amplifier 28 and second stage amplifier 30 with the second end of compensation impedance 46 coupled to ground 68.

Mute transmitter 32 functions similarly to active transmitter; however, in an opposite state. Second node, in this figure mute transmitter 32, has at least two stages, stage 1 34 comprising a first stage amplifier 36 and stage 2 64 comprising second stage amplifier 38. Again, although two stages are shown, this disclosure is intended to include any number of stages as required by the intended use. As shown in the figure, mute transmitter 32 (in an inactive state) is decoupled by the switch 56 between first stage amplifier 36 and second stage amplifier 38. As previously indicated, the coupling can be provided in any manner well known in the art. This provides for a decoupled path to Network Controller (NC) 44. Simultaneously, compensation impedance 46' is coupled by switch 60 to connecting line 62 between first stage amplifier 36 and second stage amplifier 38. The other end of compensation impedance 46' is coupled to ground 68.

With the disclosed method, the noise injected into the line when transmitter is in the mute mode will be reduced approximately by the gain of the first amplifier G1. The output noise with the traditional solution is approximately NF1+G1+G2−output loss, whereas with the present method it is only NF2+G2−output loss. For example, if NF1=NF2=5 dB, G1=20 dB, G2=10 dB, output loss=3 dB, then, with traditional solution, Output noise=5+20+10−3=32 dB (above thermal noise floor). However, with the present method, Output noise=5+10−3=12 dB, i.e. a 20 dB improvement.

FIG. 3 shows a similar embodiment of FIG. 2; however, this embodiment shows a same transmitter, first in a mute mode 32 and a transition of the transmitter to an active mode 24. In FIG. 3, impedance Z 46 is passive in a preferred embodiment to minimize noise contributions. Impedance Z 46 is designed to mimic (and substitute for) the output impedance of the first amplifier (G1) as close as possible in the frequency range of interest. The goal is to minimize the impedance change upon switchover from the amplifier to Z, thus, minimizing the change of output 66. While in the mute mode, the first amplifier can be powered off if it is desirable to save the power, but it must be turned on in time to settle and be ready for next transmission. The switchover time of the switches should be fast so that any transient while the switch changes its impedance from short to open and vice versa is out of band, and does not cause any perceivable glitch. Typically the switchover time is in the sub-nanosecond range, fast enough so the transient is well out of band. The output impedance of the first amplifier can be determined by circuit simulation, or measurement if feasible. This impedance is then the target for mimicking (over frequency of interest) by impedance Z 46, which is synthesized by passive components, in general, a combination of resistor(s), capacitor(s), and inductor(s). In some embodiments, active circuits may be added to facilitate the approximation, provided their noise contribution is low enough to be acceptable.

In one embodiment impedance Z 46 consists of a resistor only, providing a first-order match to the first amplifier's output impedance. In another embodiment, a C and L are added to the resistor, to achieve a closer approximation. In general, a higher order circuit for impedance Z 46 can be synthesized achieving arbitrarily small mismatching errors.

The following presents a simplified summary of one or more embodiments in order to provide a basic understanding of some aspects of such embodiments. This summary is not an extensive overview of the one or more embodiments, and is intended to neither identify key or critical elements of the embodiments nor delineate the scope of such embodiments. Its sole purpose is to present some concepts of the described embodiments in a simplified form as a prelude to the more detailed description that is presented later.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of mitigating transmit noise in a transmission system, comprising:
   in an active mode:
   coupling a first stage output to a second stage input; and
   decoupling an auxiliary circuit from the second stage input to ground; and
   in a mute mode:
   decoupling an output of the first stage to the second stage input; and
   coupling the auxiliary circuit from the second stage input to ground.

2. The method of claim 1 wherein coupling and decoupling comprises using a member from the group consisting of hardware, software, and firmware.

3. The method of claim 1 further comprising operating the auxiliary circuit to mimic an impedance of a first amplifier of the first stage.

4. The method of claim 1 further comprising configuring the auxiliary circuit to comprise at least one member from the group consisting of a resistive component, a capacitive component and a reactive component.

5. The method of claim 1 further comprising selecting the auxiliary circuit based on a frequency range.

6. The method of claim 1 further comprising selecting the auxiliary circuit by circuit simulation or by measurement.

7. The method of claim 1 further comprising synthesizing the auxiliary circuit to achieve a small mismatching error.

8. The method of claim 1 further comprising operating a plurality of active and mute transmitters.

9. A method of mitigating effects of an impedance change in a transmission system, comprising:
   in an active mode:
   coupling a first stage output to a second stage input; and
   decoupling a compensation impedance from the second stage input to ground; and
   in a mute mode:
   decoupling an output of the first stage to the second stage input; and
   coupling the compensation impedance from the second stage input to ground.

10. The method of claim 9 wherein the coupling and decoupling comprise coupling and decoupling a member from the group consisting of hardware, software, and firmware.

11. The method of claim 9 further comprising operating the compensation impedance to mimic an impedance of a first amplifier of the first stage.

12. The method of claim 9 further comprising configuring the compensation impedance to comprise at least one member from the group consisting of a resistive component, a capacitive component, and a reactive component.

13. The method of claim 9 further comprising selecting the compensation impedance based on a frequency range.

14. The method of claim 9 further comprising selecting the compensation impedance by circuit simulation or by measurement.

15. The method of claim 9 further comprising synthesizing the compensation impedance to achieve a small mismatching error.

16. The method of claim 9 further comprising operating a plurality of active and mute transmitters.

17. A circuit for mitigating transmit noise in a transmission system, comprising:
   first and second switches and an auxiliary circuit,
   the first switch coupling a first stage output to a second stage input and the second switch decoupling the auxiliary circuit from the second stage input and ground, for operation in an active mode; and
   the first switch decoupling an output of the first stage to the second stage input, and the second switch coupling the auxiliary circuit from the second stage input to ground, for operation in a mute mode.

18. The circuit of claim 17 wherein the first and second switch for coupling and decoupling comprise a member from the group consisting of hardware, software and firmware.

19. The circuit of claim 17 wherein the auxiliary circuit mimics an impedance of a first amplifier of the first stage.

20. The circuit of claim 17 wherein the auxiliary circuit comprises at least one member from the group consisting of a resistive component, a capacitive component and a reactive component.

21. The circuit of claim 17 further comprising a plurality of active and mute transmitters.

22. A circuit for mitigating effects of an impedance change in a transmission system, comprising:
   first and second switches and an auxiliary circuit;
   the first switch coupling a first stage output to a second stage input and the second switch decoupling the auxiliary circuit from the second stage input and ground, for operation in an active mode;
   the first switch decoupling an output of the first stage to the second stage input, and the second switch coupling the auxiliary circuit from the second stage input to ground, for operation in a mute mode.

23. The circuit of claim 22 wherein the first and second switches are selected from the group consisting of hardware, software and firmware.

24. The circuit of claim 22 wherein the auxiliary circuit mimics an impedance of a first amplifier of the first stage.

25. The circuit of claim 22 wherein the auxiliary circuit comprises at least one member from the group consisting of a resistive component, a capacitive component and a reactive component.

26. The circuit of claim 22 further comprising a plurality of active and mute transmitters.

* * * * *